United States Patent [19]
Park et al.

[11] Patent Number: 5,959,474
[45] Date of Patent: Sep. 28, 1999

[54] OUTPUT BUFFER FOR MEMORY CIRCUIT

[75] Inventors: Jong Hoon Park, Kyungki-do; Tae Hyung Jung, Seoul, both of Rep. of Korea

[73] Assignee: LG Semicon Co., Ltd., Chungcheongbuk-do, Rep. of Korea

[21] Appl. No.: 09/000,765

[22] Filed: Dec. 30, 1997

Related U.S. Application Data

[62] Division of application No. 08/534,974, Sep. 27, 1995, Pat. No. 5,773,999.

[51] Int. Cl.$^6$ ..................................................... H03K 3/00
[52] U.S. Cl. ........................... 327/112; 327/391; 327/437; 326/83
[58] Field of Search ........................... 327/108–112, 384, 327/389, 391, 434, 436, 437; 326/21, 26, 27, 81–83, 87

[56] References Cited

U.S. PATENT DOCUMENTS

| | | | |
|---|---|---|---|
| 4,024,415 | 5/1977 | Matsuura | 327/85 |
| 4,408,135 | 10/1983 | Yuyama et al. | 326/87 |
| 4,595,844 | 6/1986 | Shen | 326/86 |
| 4,964,082 | 10/1990 | Sato et al. | 365/189.09 |
| 5,003,205 | 3/1991 | Kohda et al. | 326/58 |
| 5,157,278 | 10/1992 | Min et al. | 327/534 |
| 5,319,258 | 6/1994 | Ruetz | 327/108 |
| 5,438,550 | 8/1995 | Kim | 365/233.5 |
| 5,500,611 | 3/1996 | Popat et al. | 326/87 |
| 5,519,338 | 5/1996 | Campbell et al. | 326/27 |
| 5,627,487 | 5/1997 | Keeth | 326/87 |

*Primary Examiner*—Kenneth B. Wells
*Attorney, Agent, or Firm*—Morgan, Lewis & Bockius LLP

[57] ABSTRACT

An output buffer circuit comprising a pull-up transistor, a pull-down transistor coupled to the pull-up transistor, a first voltage source for supplying a driving voltage, a second voltage source for supplying a reference voltage, a device for comparing the driving voltage with the reference voltage, a driving voltage detector for producing a signal in response to operation of the comparing device, first and second pull-up driving buffers, the first and second pull-up driving buffers being activated according to the signal from the driving voltage detector, the pull-up transistor being driven by one of the pull-up driving buffers, and first and second pull-down driving buffers, the first and second pull-down driving buffers being activated according to the signal from the driving voltage detector, and the pull-down transistor being driven by one of the pull-down driving buffers.

2 Claims, 7 Drawing Sheets

5,959,474

1

OUTPUT BUFFER FOR MEMORY CIRCUIT

This is a divisional of application Ser. No. 08/534,974, filed on Sep. 27, 1995, now U.S. Pat. No. 5,773,999.

BACKGROUND OF THE INVENTION

1. Field of the Invention

The present invention relates to various types of output buffers for a memory circuit and, more particularly, to an output buffer circuit which selects among drive buffers of a number of drive abilities.

2. Discussion of the Related Art

Generally, a data output buffer is a device which receives input data from a memory cell, amplifies the signal, and outputs this signal. The increase in operating speed due to large-scale integration of semiconductor memory devices produces a large amount of noise. The main reason for this noise is that the transistor in the output terminal of the data output buffer produces a large peak current when it undergoes a transition while having a large channel size. This causes the source wires in the chip to produce a large amount of noise, and adversely affects the performance of the semiconductor memory device by causing malfunctions.

Impulse-like peak currents are produced at the output terminal of the data output buffer for other reasons as well. For example, the small channel of the transistor which makes up the output terminal is very large compared to other circuits. Also, the voltage undergoes a full-swing operation from a 'high' source voltage to a 'low' ground voltage and vice versa.

A conventional method that modifies the pull-up and pull-down driving power according to the operating frequency to avoid noise generation is shown in FIG. 1 and disclosed in U.S. Pat. No. 5,319,258.

As shown in FIG. 1, a first driver unit 12 and a second driver unit 14 are connected in parallel. In the first driver unit 12, a pull-up NMOS transistor MN1 and a pull-down NMOS transistor MN2 are connected between the source voltage Vcc and the ground voltage Vss. An output terminal DOUT is connected to a node where the source of transistor MN1 and the drain of transistor MN2 are commonly connected. In the second driver unit 14, similar to the above first driver unit 12, a pull-up NMOS transistor MNS1 and a pull-down NMOS transistor MNS2 are connected between the source voltage Vcc and the ground voltage Vss. The above output terminal DOUT is connected to a node where the source of transistor MNS1 and the drain of transistor MNS2 are commonly connected.

An input terminal INPUT where the data is received is connected to one terminal of each of AND gates 16 and 18. The other terminals of the AND gates are connected to a select signal SEL that outputs a high or low signal according to the operating frequency to enable or disable the above second driver unit 14. Also, a first buffer 20 consisting of two inverters connected serially is connected to the input terminal INPUT. The output terminal of the first buffer 20 is connected to the gate terminal of the pull-up NMOS transistor MN1 of the first driver unit 12.

At the same time, a second buffer 22 consisting of two serially connected inverters is connected to the input terminal INPUT through an inverter I1. The output terminal of the second buffer is connected to the gate terminal of the pull-down NMOS transistor MN2 of the first driver unit 12. Here, the first and second buffers 20, 22 are delay elements for overcoming the delay time related to each signal path.

2

In the circuit of FIG. 1 described above, a fast pull-up and pull-down is necessary at a high frequency, and a high signal is output by the select signal SEL when the driving voltage is at high voltage while a low signal is output by the select signal SEL when the driving voltage is at low voltage. In other words, for a low frequency, the select signal SEL is also low and the outputs of the AND gates 16,18 become low regardless of the input signal INPUT, and the second drive unit 14 is disabled. Therefore, only the first drive unit 12 is operated according to the input signal INPUT.

When the input signal INPUT is high, the output of the first buffer 20 is high, and since an inverted signal is input to the second buffer 22 by the inverter I1, the output of the second buffer 22 becomes low. Therefore, the pull-up transistor MN1 of the first drive unit 12 is turned on and the pull-down NMOS transistor MN2 is turned off, and the output signal DOUT becomes the source voltage Vcc. On the other hand, if the input signal INPUT is low, the pull-up NMOS transistor MN1 of the first drive unit 12 is turned off and the pull-down NMOS transistor MN2 is turned on, and the output signal DOUT becomes the ground voltage Vss. Consequently, at a low frequency, only the pull-up and pull-down NMOS transistors MN1, MN2 of the first drive unit 12 are operational, so that while the speed is slowed, the noise produced is decreased.

On the other hand, at a high frequency, the select signal SEL becomes high, and the outputs of the AND gates 16,18 become high or low according to the input signal INPUT, and the outputs of the first and second buffers 20,22 also become high or low according to the input signal INPUT. Therefore, the first drive unit 12 and the second drive unit 14 are both operated according to the input signal INPUT. In other words, when the input signal INPUT is high, the pull-up NMOS transistor MN1 of the first drive unit 12 is turned on by the first buffer 20, and simultaneously, the pull-up NMOS transistor MNS1 of the second drive unit 14 is turned on by the AND gate 16.

When the input signal is low, the pull-down NMOS transistor MN2 is turned on by the second buffer 22, and simultaneously, the pull-down NMOS transistor MNS2 of the second drive unit 14 is turned on through the AND gate 18. Here, because the first drive unit 12 and the second drive unit 14 are connected in parallel, following the operating frequency, that is, for a high frequency, fast pull-up and pull-down is carried out.

FIG. 2 is a circuit describing another example of a conventional output buffer circuit. In FIG. 2, a pull-up transistor MP1 and a pull-down transistor MN1 are connected between a source voltage Vcc and a ground voltage Vss. An output terminal DOUT is connected to the node common to the source of transistor MP1 and transistor MN1.

Further, a NOR gate NOR1 operated by an input signal RD and the inverted output of an output enable signal OE, and an inverter X2 are connected serially to the gate of the pull-up transistor MP1. A NAND gate NAND1 operated by the input signal RD and the output enable signal OE, and an inverter X3 are connected serially to the gate of the pull-down transistor MN1. Here, the output enable signal OE is input to the NOR gate NOR1 through an inverter X1 and input directly to the NAND gate NAND1.

In the circuit of FIG. 2 described above, if the output enable signal OE is low, then the output of the NOR gate NOR1 is low and the output of the NAND gate NAND1 is high, regardless of the input signal RD. Then, the low output of the NOR gate NOR1 is inverted to a high signal by the inverter X2 to turn off the pull-up transistor MP1, and the high output of the NAND gate NAND1 is inverted to a low signal by the inverter X3 to turn off the pull-down transistor MN1, so that the output DOUT becomes a high impedance state.

If, on the other hand, the output enable signal OE is high and the input signal RD is high, the outputs of the NOR gate NOR1 and the NAND gate NAND1 are both low and are inverted by the inverters X2 and X3, respectively. Accordingly, the pull-up transistor MP1 is turned off and the pull-down transistor MN1 is turned on, and the output DOUT becomes low (Vss).

If the output enable signal OE is high and the input signal RD is low, the outputs of the NOR gate NOR1 and the NAND gate NAND1 are both high and are inverted by the inverters X2 and X3, respectively. Accordingly, the pull-up transistor MP1 is turned on the pull-down transistor MN1 is turned off and the output DOUT becomes high (Vcc).

However, in FIG. 1 and FIG. 2, there are disadvantages in that at a high operating frequency, the pull-up and pull-down operations become fast, and large peak currents and a large amount of noise are generated. While at a low operating frequency, the pull-up and pull-down operations become slow.

Moreover, if the size of the driving transistors is increased to satisfy a speed condition for a low voltage, a large amount of current and much noise is generated at a high voltage.

SUMMARY OF THE INVENTION

The present invention has been made in view of the above circumstances and has as an object to provide an output buffer circuit that selects a drive buffer with differing driving power by a control signal generated according to a high or low voltage.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the output buffer circuit, wherein a pull-up transistor and a pull-down transistor are connected serially between a source voltage and a ground voltage, and an output terminal is connected to the node common to the source of the pull-up transistor and the drain of the pull-down transistor, of this invention comprises a driving voltage detector that, if the chip is enabled, chooses a high voltage when the driving voltage is higher than a reference voltage, and a low voltage if the driving voltage is lower than a reference voltage, and outputs a logic signal accordingly, first and second pull-up driving buffers that are selected according to the output of the driving voltage detector and drive the pull-up transistor, and first and second pull-down driving buffers that are selected according to the output of the driving voltage detector and drive the pull-down transistor.

BRIEF DESCRIPTION OF THE DRAWINGS

The accompanying drawings, which are incorporated in and constitute a part of this specification, illustrate embodiments of the invention and together with the written description serve to explain the objects, advantages and principles of the invention. In the drawings.

DETAILED DESCRIPTION OF THE PREFERRED EMBODIMENTS

Preferred embodiments of the present invention are described below in detail.

Figure 1:
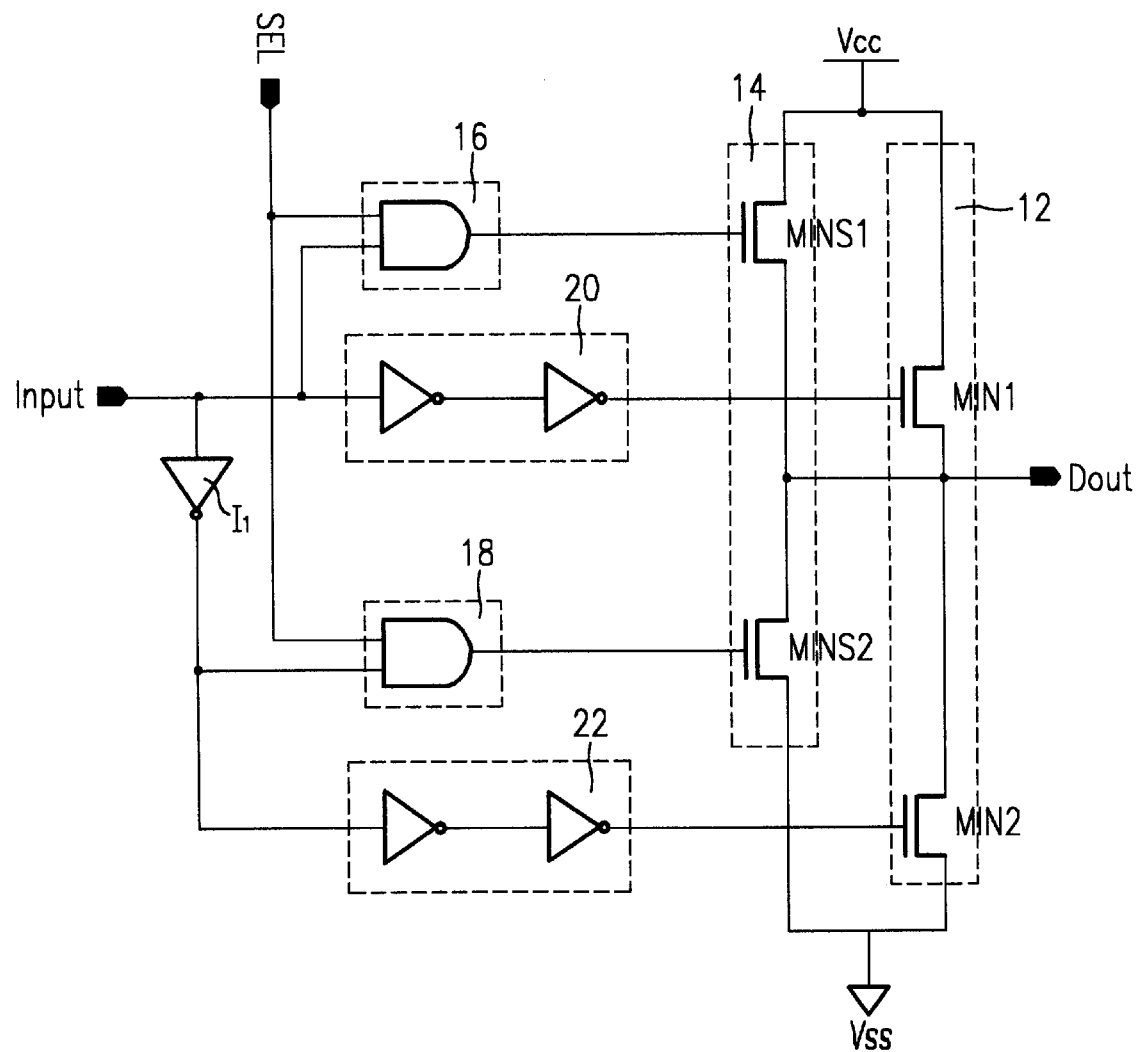
FIG. 1 is a circuit diagram showing an example of a conventional output buffer circuit.
Figure 2:
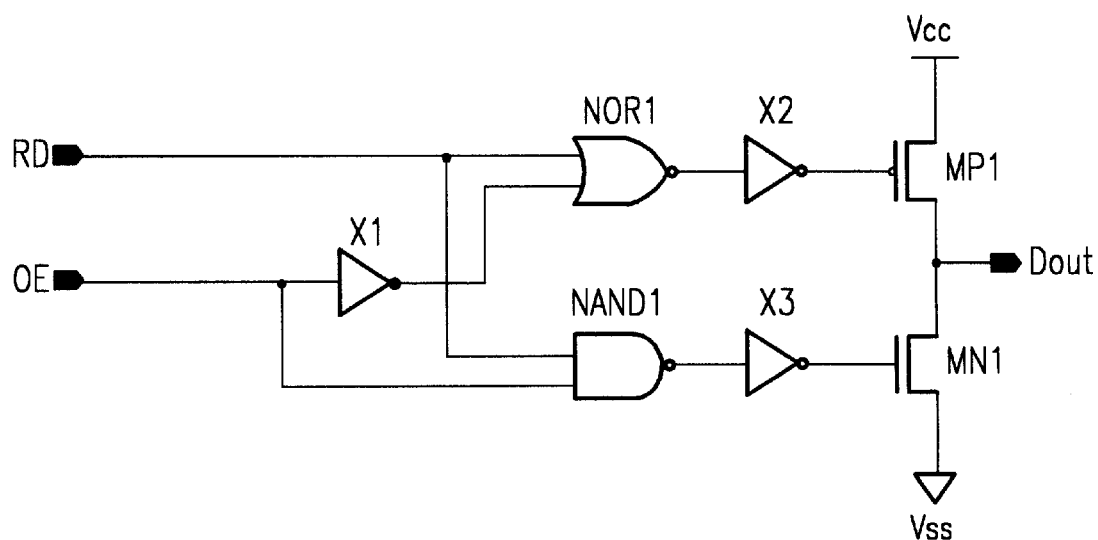
FIG. 2 is a circuit diagram showing another example of a conventional output buffer circuit.
Figure 3:
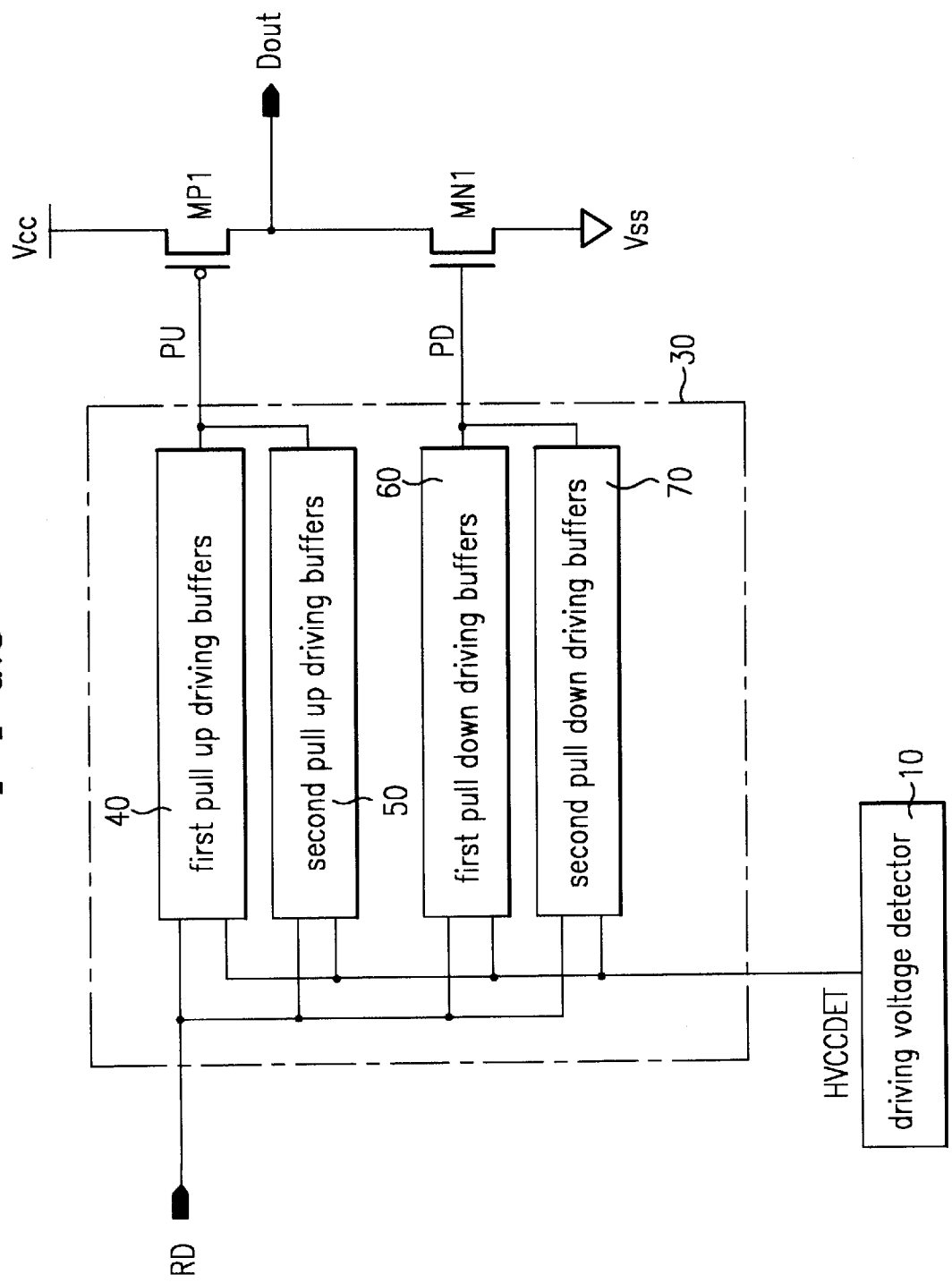
FIG. 3 is a block diagram of an embodiment of an output buffer circuit according the present invention.

FIG. 3 is a block diagram of an output buffer circuit according to the present invention. As shown in FIG. 3, the present invention includes a driving voltage detector 10 that compares the driving voltage with a reference voltage and outputs a high signal if the driving voltage is lower than the reference voltage and a low signal if the driving voltage is higher than the reference voltage. An output driving buffer circuit 30 outputs a high or a low signal through a driving buffer selected by the input signal RD, where a driving buffer of differing driving power is selected according to the output of the driving voltage detector 10, and a pull-up transistor MP1 and a pull-down transistor MN1 are driven by the output of the output driving buffer circuit 30. Here, the output driving buffer 30 comprises the first pull-up and pull-down driving buffers 40,60 which include transistors with a high driving power, and the second pull-up and pull-down driving buffers 50,70 which include transistors with a lower driving power.

The pull-up transistor MP1 is a p-channel transistor, while the pull-down transistor MN1 is an n-channel transistor. The pull-up transistor MP1 and the pull-down transistor MN1 are connected serially between the drive voltage Vcc and the ground voltage Vss. The first and second pull-up driving buffers 40,50 are connected to the gate of the pull-up transistor MP1, while the first and second pull-down driving buffers 60,70 are connected to the gate of the pull-down transistor MN1. An output terminal DOUT is connected to the node common to the source of the pull-up transistor MP1 and the drain of the pull-down transistor MN1.

Figure 4:
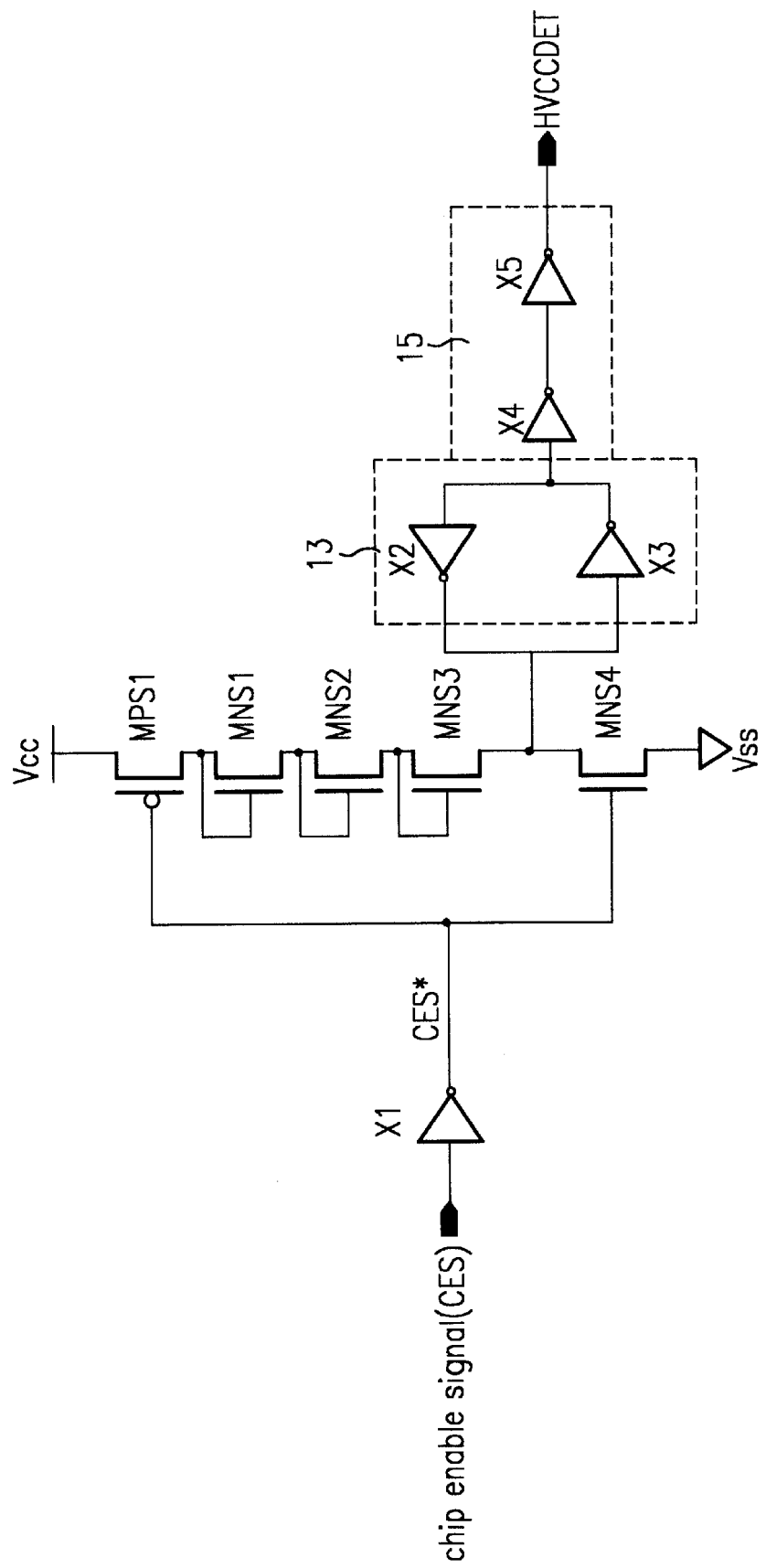
FIG. 4 is a detailed circuit diagram of the driving voltage detector of FIG. 3.

FIG. 4 is a detailed circuit diagram of the driving voltage detector 10 which includes an inverter X1 that inverts a chip enable signal CES. A PMOS transistor MPS1 and an NMOS transistor MNS4 turn on/off according to the inverted chip enable signal CES* from the inverter X1.

Here, the drain of the PMOS transistor MPS1 is connected to the source voltage Vcc, and the source of the NMOS transistor MNS4 is connected to the ground voltage Vss. Diode transistors MNS1, MNS2, and MNS3, which determine the reference voltage, are serially connected between the source of the PMOS transistor MPS1 and the drain of the NMOS transistor MNS4.

A latch 13 including inverters X2, X3 is connected to the node common to the third diode transistor MNS3 and the drain of the NMOS transistor MNS4. A buffer 15, which includes two serially connected inverters X4 and X5, is connected to the output terminal of the latch 13.

Figure 5:
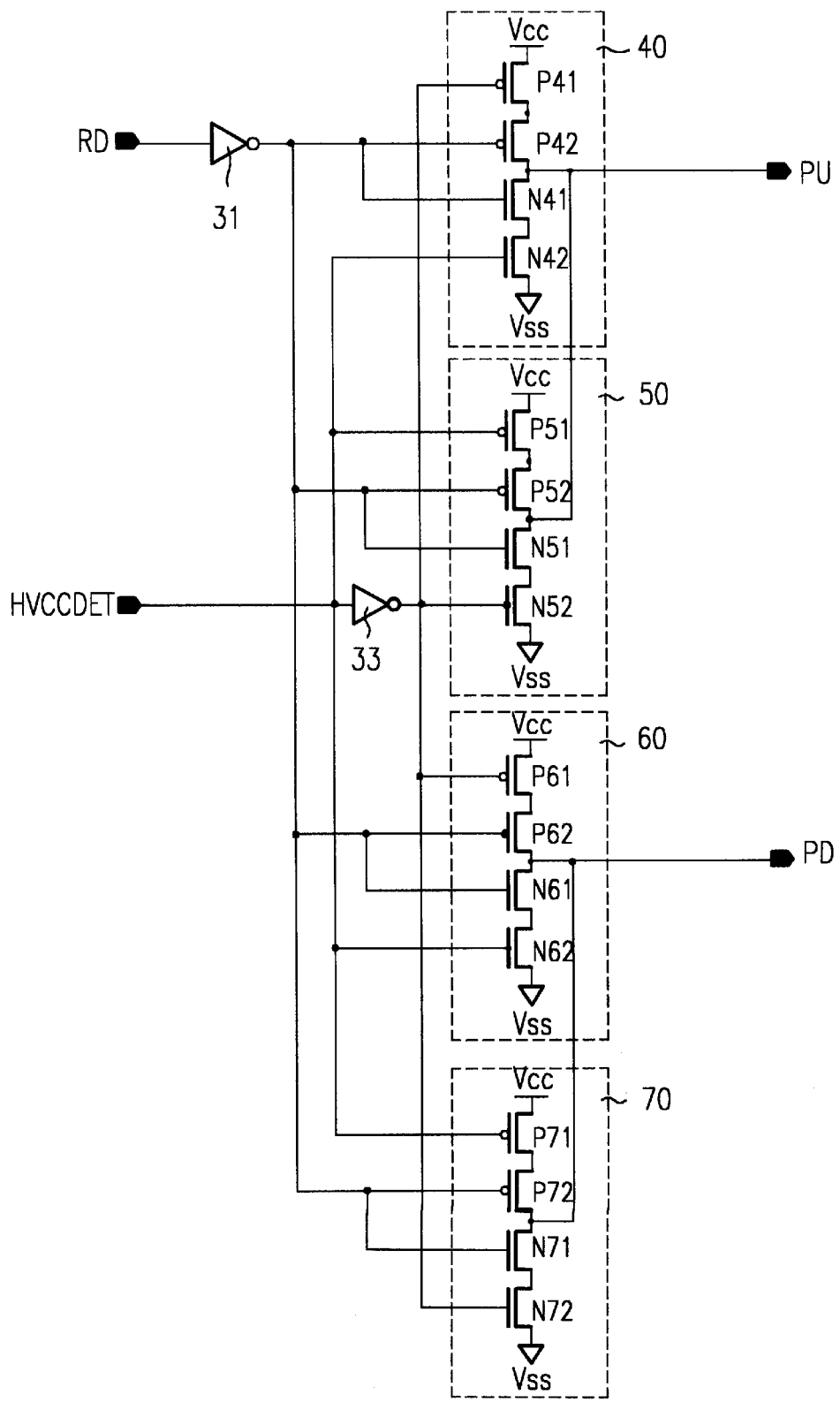
FIG. 5 is a detailed circuit diagram of the output drive buffer circuit of FIG. 3.

FIG. 5 is a detailed circuit diagram of the output driving buffer circuit 30, in which a first pull-up driving buffer 40 has transistors P41, P42, N41, and N42 connected serially between the drive voltage Vcc and ground voltage Vss, and a second pull-up driving buffer 50 has transistors P51, P52, N51, and N52 connected serially between the driving voltage Vcc and the ground voltage Vss.

Similarly, a first pull-down driving buffer 60 and a second pull-down driving buffer 70, respectively include transistors P61, P62, N61, N62 and P71, P72, N71, N72, which are serially connected between the driving voltage Vcc and the ground voltage Vss. Here, transistors with reference numbers P41, P42, P51, P52, P61, P62, P71, and P72 are PMOS transistors, and transistors with reference numbers N41, N42, N51, N52, N61, N62, N71, and N72 are NMOS transistors.

The node common to the source of the transistor P42 and the drain of the transistor N41 of the first pull-up driving buffer 40 and the node common to the source of the transistor P52 and the drain of the transistor N51 of the second pull-up driving buffer 50 are both connected to the gate of the pull-up (PU) transistor MP1. The node common to the source of the transistor and the drain of the transistor N61 of the first pull-down driving buffers 60 and the node common to the source of the transistor P72 and the drain of the transistor N71 of the second pull-down driving buffer 70 are both connected to the gate PD of the pull-down transistor MN1.

Further, the input signal RD is commonly connected to the gates of the transistors P42, N41, P52, N51, P62, N61, P72 and N71 through an inverter 31. The output HVCCDET of the driving voltage detector 10 is directly connected commonly to the gates of the transistors N42, P51, N62, and P71 and connected commonly to the gates of transistors P41, N52, P61, and N72 through an inverter 33.

In the embodiment of the present invention described above, if the chip is not selected, the chip enable signal CES input to the driving voltage detector 10 is low which is inverted by the inverter X1 to a high signal, to turn off the PMOS transistor MPS1 and turn on the NMOS transistor MNS4. Therefore, a low signal Vss is input to latch 13 by turning on the NMOS transistor MNS4. The low signal is inverted to a high signal by inverter X3 in the latch 13 and finally output as a high signal through buffer 15. Here, when the chip is not selected, the final output HVCCDET of the latch 13 continues to maintain a high voltage.

On the other hand, if the chip is selected and the chip enable signal CES is high, it is inverted by the inverter X1 to a low signal, so that the PMOS transistor is turned on and the NMOS transistor MNS4 is turned off.

Here, if the driving voltage Vcc is less than a reference voltage, when the PMOS transistor MPS1 is turned on, diode transistors MNS1, MNS2, and MNS3 are turned off. Since the driving voltage that drives a chip is generally 5V, the reference voltage is between 4.5 to 5.5 V, and this reference voltage may be determined by the diode transistors.

Therefore, if the driving voltage (Vcc) is lower than the reference voltage, diode transistors MNS1, MNS2, and MNS3 are turned off, and a low signal is applied to the latch 13. Here, if a low signal is applied to the latch 13, it is inverted to a high signal by the inverter X3 of the latch 13. The latch outputs a high signal to the output driving buffer circuit 30 through the buffer 15.

Furthermore, if the driving voltage Vcc continues to be lower than the reference voltage, the high signal output by the latch 13 is inverted by the inverter X2 to a low signal and is fed back to the input of the latch 13, so that the output of the latch 13 continues to maintain a high level.

Conversely, if the driving voltage Vcc is higher than the reference voltage, diode transistors MNS1, MNS2, and MNS3 are turned on by the driving voltage Vcc which is bypassed through the PMOS transistor MPS1 which is turned on. When diode transistors MNS1, MNS2, and MNS3 are on, a high signal is applied to the latch 13. The high signal is inverted to a low signal by the inverter X3 of the latch 13 and is output by the buffer 15. Here, while the driving voltage continues to be higher than the reference voltage, the low signal output by the latch 13 is inverted to a high signal by the inverter X2 of latch 13 and is fed back to the input of the latch 13 so that the output of the latch 13 continues to maintain a low level.

Therefore, if the chip is enabled and if the driving voltage Vcc is higher than the reference voltage, that is, a high voltage, the driving voltage detector 10 is latched by the inverters X2, X3 of the latch 13 and outputs a low signal through the buffer 15 to the output buffer circuit 30. If the driving voltage is lower than the reference voltage, that is, a low voltage, a high signal is output. Here, when a high signal is output by the driving voltage detector 10, the first pull-up and pull-down driving buffers 40 and 60 having transistors with a higher driving power are selected and the second pull-up and pull-down driving buffers 50 and 70 are disabled. When a low signal is output, the second pull-up and pull-down driving buffers 50 and 70 having transistors with less driving power are selected and the first pull-up and pull-down driving buffers 40 and 60 are disabled.

Therefore, when the output of the driving voltage detector 10 is high, that is, the driving voltage is low, and the input signal RD is high, the input signal RD is inverted by the inverter 31 to a low signal, and the transistors P42, P62 of the first pull-up and pull-down driving buffers 40 and 60 are turned on and transistors N41 and N61 are turned off.

Then, when transistors P42 and P62 are turned on, the high signal Vcc is input to the pull-up transistor MP1 and the pull-down transistor MN1 through the pull-up (PU) output terminal and the pull-down (PD) output terminal, respectively. Here, the pull-down transistor MN1 is turned on by the high signal Vcc so that the output DOUT is low (Vss). Also, if the output of the driving voltage detector 10 is high and the input signal RD is low, the input signal RD is inverted by the inverter 31 to a high signal. The transistors N41 and N61 of the first pull-up and pull-down driving buffers 40 and 60 are turned on and the transistors P42 and P62 are turned off. When the transistors N41 and N61 are turned on, a low signal is input to the pull-up transistor MP1 and the pull-down transistor MN1 through the pull-up output terminal and the pull-down output terminal, respectively. Hence, the pull-up transistor MP1 is turned on and the output DOUT becomes high (Vcc). As described above, the first pull-up and pull-down driving buffers 40 and 60 include transistors with a higher driving power than the second pull-up and pull-down driving buffers 50 and 70 so that for a low voltage, speed is increased.

However, if the output of the driving voltage detector 10 is low, that is, the driving voltage is high, and the input signal RD is high, the input signal RD is inverted by the inverter 31 to a low signal, so that transistors P52 and P72 of the second pull-up and pull-down driving buffers 40 and 60 are turned on and transistors N51 and N71 are turned off. Then, if transistors P52 and P72 are turned on, a high signal is input to the pull-up transistor MP1 and pull-down transistor MN1 through the pull-up output terminal and the pull-down output terminal. Hence, the pull-down transistor MN1 is turned on and the output DOUT is low (Vss).

Also, if the output of the driving voltage detector 10 is low and the input signal RD is low, the input signal RD is inverted by the inverter 31 to a high signal, so that the transistors N51 and N71 of the second pull-up and pull-down driving buffers 40 and 60 are turned on and the transistors P52 and P72 are turned off. If the transistors N51 and N71 are turned on, a low signal is input to the pull-up transistor MP1 and the pull-down transistor MN1 through the pull-up output terminal and the pull-down output terminal, respectively. Hence, the pull-up transistor MP1 is turned on and the output DOUT is high (Vcc).

As described, the second pull-up and pull-down driving buffers 50 and 70 have less driving power than the first pull-up and pull-down driving buffers 40 and 60. But, due to faster pull-up and pull-down operations at a high voltage, a sufficient speed margin is achieved while suppressing noise generation.

Figure 6:
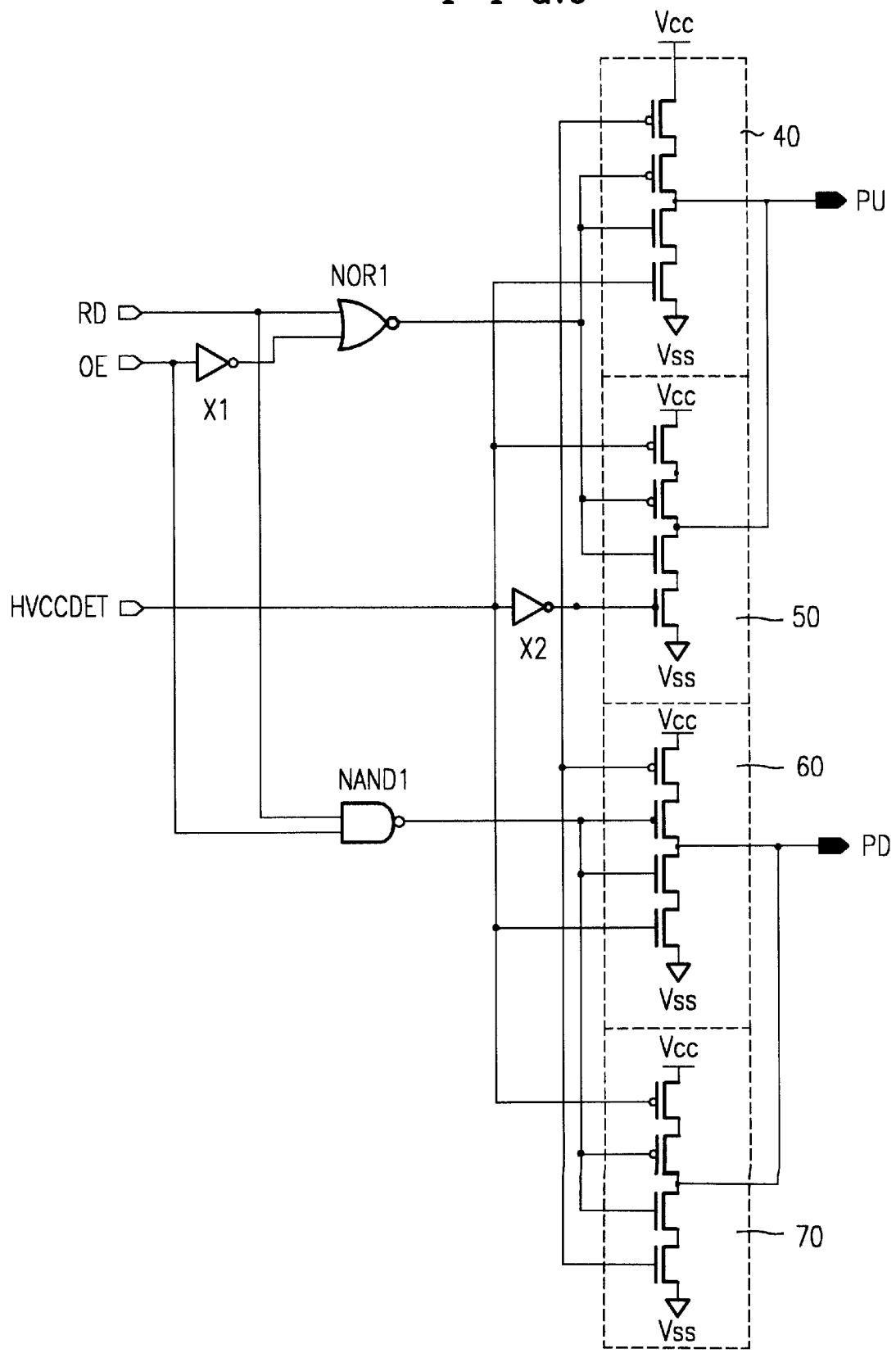
FIG. 6 is a circuit diagram of another embodiment of an output buffer circuit according to the present invention.

FIG. 6 is a circuit diagram of a different embodiment of an output buffer circuit according to the present invention, where the driving voltage detector 10 and output driving buffer circuit 30 are constructed as in FIGS. 3 through 5, and an output enable signal OE has been added. An inverter X1 inverts the output enable signal OE, a NOR gate NOR1 logically combines the inverted output enable signal OE from the inverter X1 and the input signal RD, and a NAND gate NAND1 logically combines the output enable signal OE and the input signal RD. The output of the NOR gate NOR1 is connected commonly to the first and second pull-up driving buffers 40 and 50 and the output of the NAND gate NAND1 is connected commonly to the first and second pull-down driving buffers 60 and 70. Therefore, if the output enable signal OE is high, the outputs of the NOR gate NOR1 and the NAND gate NAND1 differ according to the input signal RD, and the circuit operates as described in FIGS. 3 through 5.

However, if the output enable signal OE is low, the output of the NOR gate NOR1 is low and the output of the NAND gate NAND1 is high regardless of the input signal RD. Here, the low signal output by the NOR gate NOR1 is inverted to a high signal by the output driving buffer circuit 30 so that the pull-up transistor MP1 is turned off. At the same time, the high signal output by the NAND gate NAND1 is inverted to a low signal by the output driving buffer circuit 30, so that the pull-down transistor MN1 is turned off, and the output DOUT becomes a high impedance state.

As described above, in FIG. 6, if the output enable signal OE is low, regardless of the output of the driving voltage detector 10 and the input signal RD, the output becomes a high impedance state. If the output enable signal OE is high, the output buffer operates normally according to the driving voltage detector 10 and the input signal RD.

Figure 7:
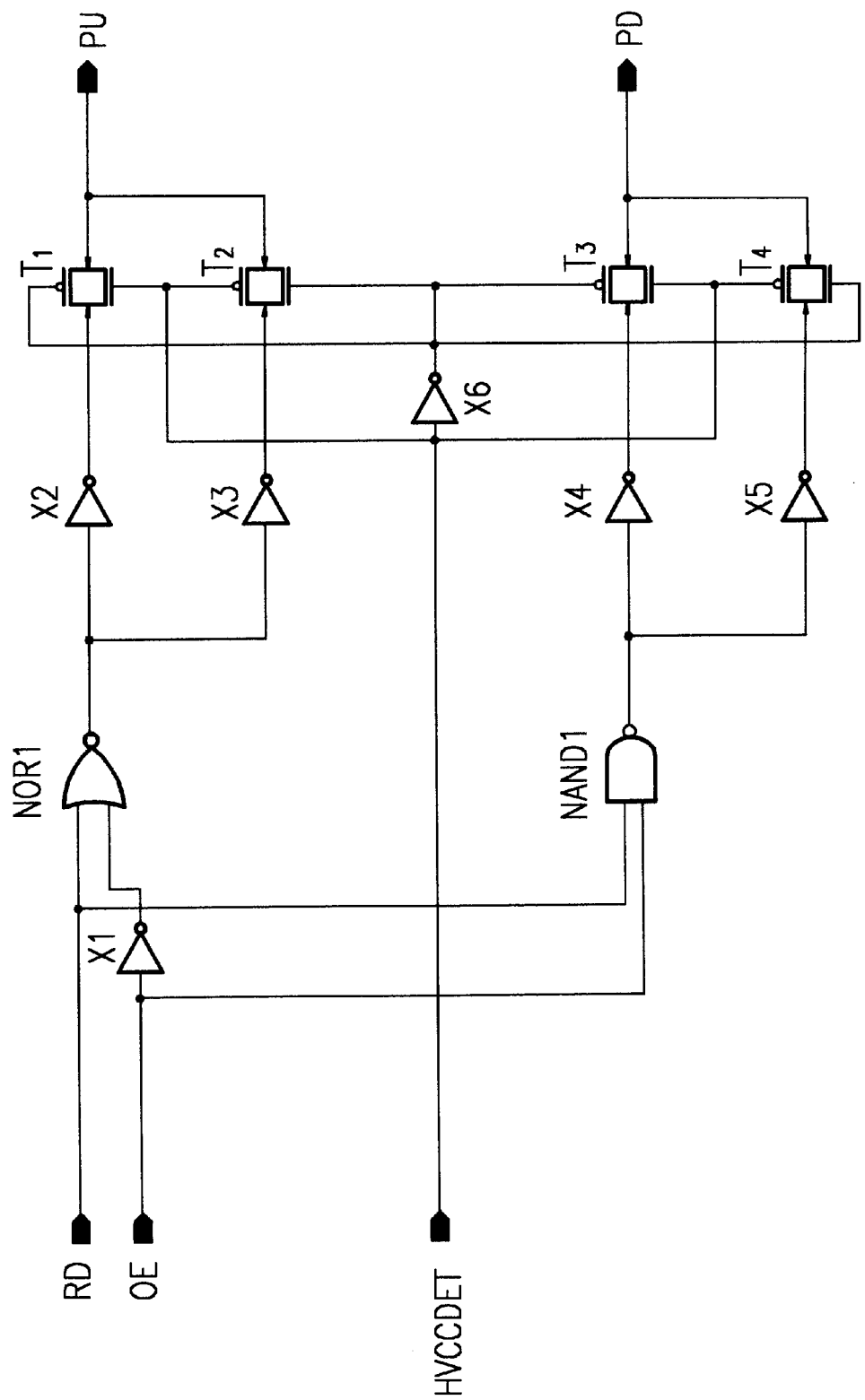
FIG. 7 is a circuit diagram of yet another embodiment of an output buffer circuit according to the present invention.

FIG. 7 is another embodiment of an output buffer circuit according to the present invention. An inverter X1 inverts the output enable signal OE, and a NOR gate NOR1 logically combines the inverted output enable signal OE from the inverter X1 and the input signal RD. A NAND gate NAND1 logically combines the noninverted output enable signal OE and input signal RD. Inverters X2 and X3 each invert the output of the NOR gate NOR1, and inverters X4 and X5 each invert the output of the NAND gate NAND1. Transmission gates T1, T2, T3, and T4 are connected to the outputs of the inverters X2, X3, X4, and X5 and are driven by the output signal HVCCDET of the driving voltage detector 10. Here, inverters X2 and X4 have a higher driving power, and inverters X3 and X5 have less driving power.

As described above, in FIG. 7, transmission gates T1 and T3 electrically conduct when the output HVCCDET of the driving voltage detector 10 is high, and transmission gates T2 and T4 are conduct when the output HVCCDET is low. Here, if the output enable signal OE is low, then as in FIG. 6, the output of the NOR gate NOR1 is low and the output of the NAND gate NAND1 is high regardless of the input signal RD so that a high signal from the inverters X2 and X3 pass through the transmission gates T1 and T2 and turn off the pull-up transistor MP1. Simultaneously, low signals from the inverters X4 and X5 pass through the transmission gates T3 and T4 and turn off the pull-down transistor MN1 so that the final output signal DOUT becomes a high impedance state.

On the other hand, if the output enable signal OE and the output HVCCDET of the driving voltage detector 10 are high and the input signal RD is high, the outputs of the NOR gate NOR1 and NAND gate NAND1 are both low, and are inverted by the respective inverters X2, X3, X4, and X5, and input to transmission gates T1, T2, T3, and T4.

Here, only transmission gates T1 and T3 conduct due to the output signal HVCCDET, so that the high signals from inverters X2 and X4 with higher driving powers are passed through transmission gates T1 and T3 and input to the pull-up transistor MP1 and pull-down transistor MN1. Therefore, the pull-down transistor MN1 is turned on by the high signal and the output DOUT becomes low (Vss).

Also, if the output enable signal OE is high and the output HVCCDET of the driving voltage detector 10 is low with the input signal RD high, the outputs of the NOR gate NOR1 and NAND gate NAND1 are both low, and are inverted to high signals by the respective inverters X2, X3, X4, and X5, and are respectively input to the transmission gates T1, T2, T3, and T4. Here, only transmission gates T2 and T4 conduct due to the signal HVCCDET. Hence, the high signals from inverters X3 and X4 with less driving power are passed through transmission gates T2 and T4 and input to pull-up transistor MP1 and pull-down transistor MN1, so that pull-down transistor MN2 is turned on, and the output DOUT becomes low Vss.

On the other hand, if the output enable signal OE and the output HVCCDET of the driving voltage detector 10 is high with the input signal RD low, the outputs of the NOR gate NOR1 and the NAND gate NAND1 are both high. The high signals are inverted to low signals by the inverters X2, X3, X4, and X5 and are passed through transmission gates T1 and T3 to turn on pull-up transistor MP1, so that the output DOUT becomes high (Vcc).

Also, if the output enable signal OE is high, and the output HVCCDET of the driving voltage detector 10 and the input signal RD are low, the outputs of the NOR gate NOR1 and NAND gate NAND1 are both high, and are inverted by inverters X2, X3, X4, and X5 and are passed through transmission gates T2 and T4 to turn on pull-up transistor MP1, so that similarly, output DOUT becomes high Vcc.

As described above, in FIG. 7, inverters X2 and X4 with a high driving power and inverters X3 and X5 with less driving power are always operational. The transmission gates T1, T2, T3, and T4 are selectively opened by the output signal HVCCDET of the driving voltage detector 10, so that a sufficient speed margin is achieved at a high voltage while suppressing noise generation. Hence, speed is improved for a low voltage.

Furthermore, the present invention may be applied to an output drive buffer, a wordline driver, or drive buffers for outputs of various internal control signals.

As described above, an output buffer circuit according to the present invention has advantages in that pull-up and pull-down operations are carried out by selecting a driver with the least possible driving power satisfying the speed margin when the driving voltage is high compared to the reference voltage, and a driver with a higher driving power is selected if the driving voltage is low compared to the reference voltage. Hence, speed variations due to voltage changes are minimized and power loss and peak currents are decreased. Noise generation is suppressed at high voltage and a sufficient speed margin is achieved to improve speed at low voltage.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An output buffer circuit for a semiconductor chip, comprising:
    a pull-up transistor;
    a pull-down transistor;
    a first logic gate for performing a first logic operation on an input signal and an inverted output enable signal;
    a second logic gate for performing a second logic operation on the input signal and an output enable signal;
    a first inverter and a second inverter, each having an output terminal, the first and second inverter being connected in parallel and connected with the first logic gate for inverting an output of the first logic gate, wherein the first and second inverters have different driving powers;
    a third inverter and a fourth inverter, each having an output terminal, the third and fourth inverter being connected in parallel and connected with the second logic gate for inverting an output of the second logic gate;
    means for comparing a driving voltage with a reference voltage;
    a driving voltage detector for producing a signal in response to operation of the comparing means;
    a first transmission gate and a second transmission gate connected to the output terminals of the first and second inverters, respectively, and being activated by the signal of the driving voltage detector to drive the pull-up transistor; and
    a third transmission gate and a fourth transmission gate connected to the output terminals of the third and fourth inverters, respectively, and being activated by the signal of the driving voltage detector to drive the pull-down transistor.

2. An output buffer circuit for a semiconductor chip, comprising:
    a pull-up transistor;
    a pull-down transistor;
    a first logic gate for performing a first logic operation on an input signal and an inverted output enable signal;
    a second logic gate for performing a second logic operation on the input signal and an output enable signal;
    a first inverter and a second inverter, each having an output terminal, the first and second inverter being connected in parallel and connected with the first logic gate for inverting an output of the first logic gate;
    a third inverter and a fourth inverter, each having an output terminal, the third and fourth inverter being connected in parallel and connected with the second logic gate for inverting an output of the second logic gate, wherein the third and fourth inverters have different driving powers;
    means for comparing a driving voltage with a reference voltage;
    a driving voltage detector for producing a signal in response to operation of the comparing means;
    a first transmission gate and a second transmission gate connected to the output terminals of the first and second inverters, respectively, and being activated by the signal of the driving voltage detector to drive the pull-up transistor; and
    a third transmission gate and a fourth transmission gate connected to the output terminals of the third and fourth inverters, respectively, and being activated by the signal of the driving voltage detector to drive the pull-down transistor.

* * * * *